United States Patent
Yamaguchi et al.

(10) Patent No.: US 7,378,215 B2
(45) Date of Patent: May 27, 2008

(54) POSITIVE PHOTORESIST COMPOSITION

(75) Inventors: Hiromasa Yamaguchi, Annaka (JP); Hideto Kato, Annaka (JP)

(73) Assignee: Shin-Etsu Chemical Co., Ltd., Tokyo (JP)

(*) Notice: Subject to any disclaimer, the term of this patent is extended or adjusted under 35 U.S.C. 154(b) by 0 days.

(21) Appl. No.: 11/637,103

(22) Filed: Dec. 12, 2006

(65) Prior Publication Data
US 2007/0134591 A1 Jun. 14, 2007

(30) Foreign Application Priority Data
Dec. 13, 2005 (JP) ............................. 2005-358960

(51) Int. Cl.
*G03F 7/023* (2006.01)

(52) U.S. Cl. ...................... 430/191; 430/192; 430/193

(58) Field of Classification Search ............... 430/191, 430/192, 193
See application file for complete search history.

(56) References Cited

U.S. PATENT DOCUMENTS

| 4,504,567 | A | 3/1985 | Yamamoto et al. |
| 6,866,982 | B2 * | 3/2005 | Kato et al. ............ 430/270.1 |

FOREIGN PATENT DOCUMENTS

| JP | 57-178242 A | 11/1982 |
| JP | 59-142538 A | 8/1984 |
| JP | 03-022619 A | 1/1991 |
| JP | 2000-181055 A | 6/2000 |

* cited by examiner

*Primary Examiner*—John S. Chu
(74) *Attorney, Agent, or Firm*—Birch, Stewart, Kolasch & Birch, LLP

(57) ABSTRACT

A positive photoresist composition comprising an alkali-soluble resin, a 1,2-quinonediazide compound, an organic solvent, and a fluorinated organosilicon compound of formula (1) serving as a surfactant can be effectively coated to uniformity over large areas and is improved in resist pattern profile. Rf is a $C_5$-$C_{30}$ perfluoroalkyl group containing at least one ether bond, Q is a polyether group consisting of an ethylene glycol and/or propylene glycol polymer chain, R is H or $C_1$-$C_4$ alkyl, X is a divalent linking group exclusive of oxygen, Y is a divalent linking group, p is an integer of at least 3, and $0<n<3$.

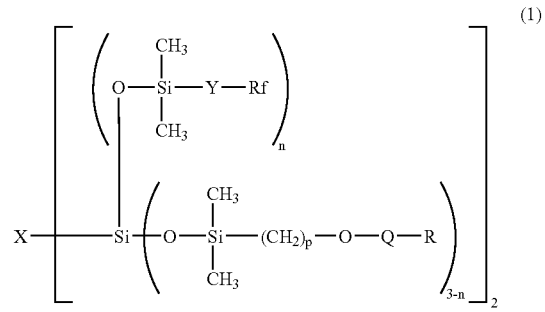

10 Claims, No Drawings

POSITIVE PHOTORESIST COMPOSITION

CROSS-REFERENCE TO RELATED APPLICATION

This non-provisional application claims priority under 35 U.S.C. §119(a) on Patent Application No. 2005-358960 filed in Japan on Dec. 13, 2005, the entire contents of which are hereby incorporated by reference.

TECHNICAL FIELD

This invention relates to positive photoresist compositions which can be effectively coated to uniformity over large areas and are improved in resist pattern profile as essentially required for compositions of this type.

BACKGROUND ART

JP-A 3-22619 discloses a positive photoresist composition comprising an alkali-soluble resin and an alkali-insoluble 1,2-quinonediazide compound. When this composition is exposed to UV through a mask and developed with a developer in the form of an aqueous alkaline solution, the composition can form a resist pattern faithful to the mask pattern at a high resolution because the composition is scarcely dissolvable or swollen in an aqueous alkaline solution as the developer. Spedifically, the 1,2-quinonediazide compound in the exposed areas is converted to alkali-soluble indene carboxylic acid while the unexposed areas to form the resist pattern are little changed during development. In the current industry requiring higher integration of ICs, positive photoresists featuring resolution are used most often.

In the field of manufacturing liquid crystal display devices using small-size glass substrates, the resist applying method used is a spin coating method of dropping a resist solution at the center of a substrate and rotating the substrate. The spin coating method ensures coating uniformity. In the case of large-size substrates of the 1×1 meter square order, however, considerably large amounts of resist solution are spun off during rotation and thus discarded. The high-speed rotation also causes substrates to be broken and raises a problem in taking a cycle time. Since the coating ability of a spin coating method involving central dropping and rotation depends on the rotational speed and the coating weight of resist solution, a problem arises if the spin coating method is applied to more large-sized substrates of the fifth generation (of approximately 1,000 mm×1,200 mm to 1,280 mm×1,400 mm). That is, there are available no general-purpose motors capable of acceleration as needed. Customizing a special motor leads to increased part costs. Because the performance parameters required for the coating process including a coating uniformity of ±3% and a cycle time of 60-70 sec per substrate remain unchanged even when the substrate and the apparatus become enlarged in size, the spin coating method involving central dropping and rotation is difficult to accommodate the requirements other than coating uniformity.

Under the circumstances, a resist coating method of nozzle injection is proposed as a new resist coating method that can comply with large-size substrates of the fifth or later generation.

Meanwhile, surfactants are added to positive photoresists for the purposes of improving coating efficiency and striation as well as the developability of radiation-exposed areas after dry film formation. Among others, fluorochemical surfactants and fluorine-silicon surfactants are widely utilized for leveling and coating characteristics.

JP-A 2000-181055 discloses a positive photoresist composition suitable for liquid crystal device manufacture comprising a non-ionic fluorine-silicon surfactant having specific fluorine and silicon contents, which can be effectively coated without striation, drying unevenness and dripping marks, and are good in resist pattern profile as essentially required for compositions of this type. However, this photoresist composition is still unsatisfactory in that streaks can form on a coating if the composition is applied by the nozzle injection coating method referred to above.

While continuous demands for larger size and higher definition are imposed on substrates, it would be desirable to have a positive photoresist composition which ensures coating uniformity even when coated over large areas and are improved in resist pattern profile as essentially required for compositions of this type.

DISCLOSURE OF THE INVENTION

An object of the invention is to provide a positive photoresist composition which ensures coating uniformity over large areas and is improved in resist pattern profile.

The inventors has found that when a fluorinated organosilicon compound having the general formula (1), defined below, is incorporated as a surfactant in a positive photoresist composition comprising an alkali-soluble resin, a 1,2-quinonediazide compound, and an organic solvent, the resultant positive photoresist composition is effectively coated to uniformity, eliminates drying unevenness, and forms a definite resist pattern profile.

Accordingly, the invention provides a positive photoresist composition comprising (A) an alkali-soluble resin, (B) a 1,2-quinonediazide compound, (C) an organic solvent, and (D) a fluorinated organosilicon compound having the general formula (1) serving as a surfactant.

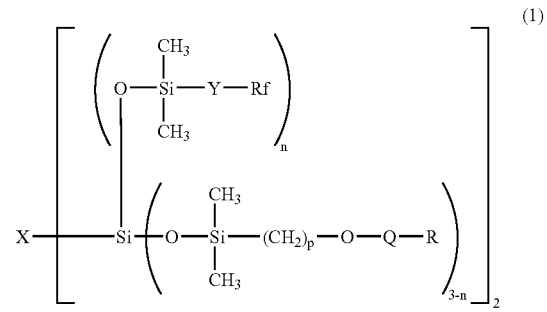

Herein Rf is a perfluoroalkyl group of 5 to 30 carbon atoms containing at least one ether bond in the molecular chain, Q is a polyether group consisting of a homopolymer chain of ethylene glycol or propylene glycol or a copolymer chain of both, R is hydrogen or an alkyl group of 1 to 4 carbon atoms, X is a divalent linking group exclusive of oxygen, Y is a divalent linking group, p is an integer of at least 3, and n is a positive number in the range: $0<n<3$.

BENEFITS OF THE INVENTION

The positive photoresist composition of the invention ensures coating uniformity even when coated over large areas, eliminates drying unevenness, and forms a definite resist pattern profile.

DESCRIPTION OF THE PREFERRED EMBODIMENT

The positive photoresist composition of the invention is arrived at by compounding (A) an alkali-soluble resin, (B) a 1,2-quinonediazide compound, (C) an organic solvent, and (D) a fluorinated organosilicon compound having the general formula (1), which are described below in detail.

A. Alkali-soluble Resin

The alkali-soluble resin used herein may be selected from resins having phenol or carboxyl groups, including phenolic resins such as phenol novolac resins and cresol novolac resins, polyhydroxystyrene resins, acrylic resins, and the like. Of these, preferred are cresol novolac resins obtained through polycondensation of cresols with aldehydes.

Examples of cresols used as the starting reactant to the cresol novolac resins include o-cresol, m-cresol, p-cresol, 2,3-xylenol, 2,4-xylenol, 2,5-xylenol, 2,6-xylenol, 3,4-xylenol, 3,5-xylenol, 2,3,5-trimethylphenol, and 3,4,5-trimethylphenol. These cresols may be used alone or in admixture of two or more. Inter alia, m-cresol, p-cresol, 2,3-xylenol, 2,5-xylenol, 3,4-xylenol, 3,5-xylenol, and 2,3,5-trimethylphenol are preferred.

Examples of aldehydes to be polycondensed with the cresols to form the phenolic resins include formaldehyde, acetaldehyde, propyl aldehyde, benzaldehyde, phenyl acetaldehyde, α-phenylpropyl aldehyde, β-phenylpropyl aldehyde, o-hydroxybenzaldehyde, m-hydroxybenzaldehyde, p-hydroxybenzaldehyde, o-chlorobenzaldehyde, m-chlorobenzaldehyde, p-chlorobenzaldehyde, o-nitrobenzaldehyde, m-nitrobenzaldehyde, p-nitrobenzaldehyde, o-methylbenzaldehyde, m-methylbenzaldehyde, p-methylbenzaldehyde, p-ethylbenzaldehyde, p-n-butylbenzaldehyde, and furfural. These aldehydes may be used alone or in admixture of two or more. Inter alia, formaldehyde is most preferred.

The phenol and the aldehyde are preferably combined in such amounts that the aldehyde is 0.7 to 3 moles, more preferably 0.8 to 1.8 moles per mole of the phenol.

In effecting polycondensation of phenols with aldehydes, acidic catalysts are used. Suitable acidic catalysts include hydrochloric acid, nitric acid, sulfuric acid, formic acid, oxalic acid, and acetic acid. The acidic catalyst is customarily used in an amount of $1 \times 10^{-5}$ to $5 \times 10^{-1}$ mole per mole of the phenol. The polycondensation can be conducted by a standard process.

The alkali-soluble resin generally has a weight average molecular weight (Mw) of 2,000 to 50,000, and preferably 3,000 to 40,000, as measured by gel permeation chromatography (GPC) versus polystyrene standards. If Mw of the resin is more than 50,000, some positive resist compositions are difficult to coat onto substrates uniformly and tend to become low in development, sensitivity and resolution. With Mw less than 2,000, there is a propensity for losing heat resistance.

B. 1,2-quinonediazide Compound

The 1,2-quinonediazide compound used herein is not particularly limited. A choice may be made, for example, among 1,2-benzoquinonediazido-4-sulfonic acid esters, 1,2-naphthoquinonediazido-4-sulfonic acid esters, and 1,2-naphthoquinonediazido-5-sulfonic acid esters.

Illustrative, non-limiting examples of suitable 1,2-quinonediazide compounds include 1,2-quinonediazidosulfonic acid esters of (poly)hydroxybenzene such as p-cresol 1,2-benzoquinonediazido-4-sulfonate, resorcinol 1,2-naphthoquinonediazido-4-sulfonate, and pyrogallol 1,2-naphthoquinonediazido-5-sulfonate;

1,2-quinonediazidosulfonic acid esters of (poly)hydroxyphenyl alkyl ketones or (poly)hydroxyphenyl aryl ketones such as 2,4-dihydroxyphenyl-propylketone 1,2-benzoquinonediazido-4-sulfonate, 2,4-dihydroxyphenyl-n-hexylketone 1,2-naphthoquinonediazido-4-sulfonate, 2,4-dihydroxybenzophenone 1,2-naphthoquinonediazido-5-sulfonate, 2,3,4-trihydroxyphenyl-n-hexylketone 1,2-naphthoquinone-diazido-4-sulfonate, 2,3,4-trihydroxybenzophenone 1,2-naphthoquinonediazido-4-sulfonate, 2,3,4-trihydroxybenzophenone 1,2-naphthoquinonediazido-5-sulfonate, 2,4,6-trihydroxybenzophenone 1,2-naphthoquinonediazido-4-sulfonate, 2,4,6-trihydroxybenzophenone 1,2-naphthoquinonediazido-5-sulfonate, 2,2',4,4'-tetrahydroxybenzophenone 1,2-naphthoquinonediazido-5-sulfonate, 2,3,4,4'-tetrahydroxybenzophenone 1,2-naphthoquinonediazido-5-sulfonate, 2,2',4,4'-tetrahydroxybenzophenone 1,2-naphthoquinonediazido-4-sulfonate, 2,3,4,4'-tetrahydroxybenzophenone 1,2-naphthoquinonediazido-4-sulfonate, 2,2',3,4,6'-pentahydroxybenzophenone 1,2-naphthoquinonediazido-4-sulfonate, 2,2',3,4,6'-pentahydroxybenzophenone 1,2-naphthoquinonediazido-5-sulfonate, 2,3,3',4,4',5'-hexahydroxybenzophenone 1,2-naphthoquinonediazido-4-sulfonate, 2,3,3',4,4',5'-hexahydroxybenzophenone 1,2-naphthoquinonediazido-5-sulfonate, 2,3',4,4',5,6-hexahydroxybenzophenone 1,2-naphthoquinonediazido-4-sulfonate, and 2,3',4,4',5',6-hexahydroxybenzophenone 1,2-naphthoquinonediazido-5-sulfonate;

1,2-quinonediazidosulfonic acid esters of bis[(poly)hydroxyphenyl]alkanes such as bis(p-hydroxyphenyl)methane 1,2-naphthoquinonediazido-4-sulfonate, bis(2,4-dihydroxyphenyl)methane 1,2-naphthoquinonediazido-5-sulfonate, bis(2,3,4-trihydroxyphenyl)methane 1,2-naphthoquinonediazido-5-sulfonate, 2,2-bis(p-hydroxyphenyl)propane 1,2-naphthoquinonediazido-4-sulfonate, 2,2-bis(2,4-dihydroxyphenyl)propane 1,2-naphthoquinonediazido-5-sulfonate, 2,2-bis(2,3,4-trihydroxyphenyl)propane 1,2-naphthoquinonediazido-5-sulfonate;

1,2-quinonediazidosulfonic acid esters of (poly)hydroxybenzoic acid alkyl esters or (poly)hydroxybenzoic acid aryl esters such as lauryl 3,5-dihydroxybenzoate 1,2-naphthoquinonediazido-4-sulfonate, phenyl 2,3,4-trihydroxybenzoate 1,2-naphthoquinonediazido-5-sulfonate, propyl 3,4,5-trihydroxybenzoate 1,2-naphthoquinonediazido-5-sulfonate, and phenyl 3,4,5-trihydroxybenzoate 1,2-naphthoquinonediazido-5-sulfonate;

1,2-quinonediazidosulfonic acid esters of bis[(poly)hydroxybenzoyl]alkanes or bis[(poly)hydroxybenzoyl]benzenes such as bis(2,5-dihydroxybenzoyl)methane 1,2-naphthoquinonediazido-4-sulfonate, bis(2,3,4-trihydroxybenzoyl)methane 1,2-naphthoquinonediazido-5-sulfonate, bis(2,4,6-trihydroxybenzoyl)methane 1,2-naphthoquinonediazido-5-sulfonate, p-bis(2,5-dihydroxybenzoyl)benzene 1,2-naphthoquinonediazido-4-sulfonate, p-bis(2,3,4-trihydroxybenzoyl)benzene 1,2-naphthoquinone-diazido-5-sulfonate, and p-bis(2,4,6-trihydroxybenzoyl)benzene 1,2-naphthoquinonediazido-5-sulfonate;

1,2-quinonediazidosulfonic acid esters of (poly)ethylene glycol di[(poly)hydroxybenzoate] such as ethylene glycol di(3,5-dihydroxybenzoate) 1,2-naphthoquinonediazido-5-sulfonate, polyethylene glycol di(3,4,5-trihydroxybenzoate) 1,2-naphthoquinonediazido-5-sulfonate;

1,2-quinonediazidosulfonic acid esters of α-pyrone natural dyes having hydroxyl group, 1,2-quinonediazidosulfonic acid esters of γ-pyrone natural dyes having hydroxyl group, and 1,2-quinonediazidosulfonic acid esters of diazine natural dyes having hydroxyl group.

An appropriate amount of component (B) is 15 to 40 parts, especially 20 to 30 parts by weight per 100 parts by weight of component (A). Outside the range, too less amounts of component (B) may result in a substantial lowering of transfer, failing to form a resist pattern with the desired profile. Too large amounts of component (B) may detract from sensitivity and resolution and are likely to leave residues after development.

C. Organic Solvent

Examples of the solvent which can be used herein include, but are not limited to, glycol ethers such as ethylene glycol monomethyl ether, ethylene glycol monoethyl ether, ethylene glycol monomethyl ether acetate, ethylene glycol monoethyl ether acetate, diethylene glycol monomethyl ether, diethylene glycol monoethyl ether, propylene glycol monomethyl ether acetate (PGMEA), and propylene glycol monopropyl ether acetate; aromatic hydrocarbons such as toluene and xylene; ketones such as methyl ethyl ketone, 2-heptanone, 3-heptanone, 4-heptanone, and cyclohexanone; and esters such as ethyl 2-hydroxypropionate, ethyl 2-hydroxy-2-methylpropionate, ethyl ethoxyacetate, ethyl hydroxyacetate, methyl 2-hydroxy-3-methylbutyrate, methyl 3-methoxypropionate, ethyl 3-methoxypropionate, methyl 3-ethoxypropionate, ethyl 3-ethoxypropionate, ethyl acetate, butyl acetate, methyl pyruvate, and ethyl pyruvate. These solvents may be used alone or in admixture.

The foregoing solvents may be used in combination with high-boiling solvents, for example, N-methylformamide, N,N-dimethylformamide, N-methylformamide, N-methylacetamide, N,N-dimethylacetamide, N-methylpyrrolidone, dimethyl sulfoxide, benzyl ethyl ether, dihexyl ether, acetonylacetone, isophorone, caproic acid, caprylic acid, 1-octanol, 1-nonanol, benzyl alcohol, benzyl acetate, ethyl benzoate, diethyl oxalate, diethyl maleate, γ-butyrolactone, ethylene carbonate, propylene carbonate, and ethylene glycol monophenyl ether acetate.

The amount of the organic solvent used is not particularly limited. For example, the organic solvent (C) is used in such amounts that the total amount of components (A), (B) and (D) is less than or equal to 35% by weight, preferably 10 to 30% by weight, more preferably 10 to 25% by weight based on the total weight of the composition comprising components (A) to (D).

D. Fluorinated Organosilicon Compound

The fluorinated organosilicon compound used herein serves as a surfactant and has the general formula (1).

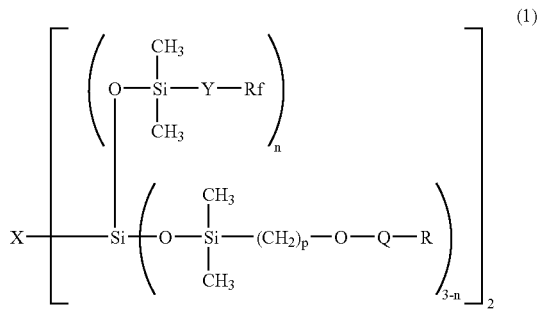

(1)

Herein Rf is a perfluoroalkyl group of 5 to 30 carbon atoms containing at least one ether bond in the molecular chain, Q is a polyether group consisting of a homopolymer chain of ethylene glycol or propylene glycol or a copolymer chain of both, R is hydrogen or an alkyl group of 1 to 4 carbon atoms, X is a divalent linking group exclusive of oxygen, Y is a divalent linking group, p is an integer of at least 3, and n is a positive number in the range: 0<n<3.

More specifically, Rf is a perfluoroalkyl group of 5 to 30 carbon atoms, preferably 8 to 20 carbon atoms, containing at least one ether bond in the molecular chain. Outside the range, a larger number of carbon atoms gives a compound with a larger molecular weight, which is less soluble in solvents on use as a surfactant. If the number of carbon atoms is smaller than the range, the fluorinated group fails to exert its effect to a full extent, and no sufficient surface activation is achieved.

Examples of Rf are given below.

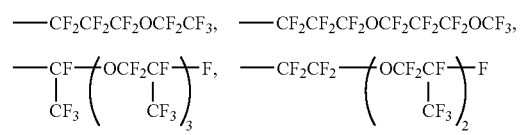

Of these, Rf groups having the following formula (2) are desirable.

(2)

Herein, s is an integer of 1 to 9, especially 2 to 5.

The organosilicon compound of formula (1) wherein Rd. is a perfluoroalkyl group containing at least one ether bond has a higher surface tension-reducing capability than a perfluoroalkyl group-modified compound, provided that both have the same fluorine modification rate. This ensures the advantage of a reduced addition amount.

Q is a polyether group which consists of an ethylene glycol homopolymer chain, a propylene glycol homopolymer chain or a copolymer (block polymerization or random polymerization) chain of ethylene glycol and propylene glycol. A choice may be made among these chains depending on a particular application of the fluorinated organosilicon compound.

The polyether group has a degree of polymerization which may be determined in consideration of a balance with the hydrophobic fluorinated organic group Rd. When a homopolymer chain of ethylene glycol is used, the degree of polymerization is preferably 3 to 20, more preferably 3 to 12. When a homopolymer chain of propylene glycol which is less hydrophilic than ethylene glycol is used, a relatively high degree of polymerization is preferred, specifically in the range of 100 to 200. In the case of a copolymer chain of ethylene glycol and propylene glycol, the propylene glycol content is customarily in the range of 0.1 to 50 mol %, preferably 2 to 10 mol % based on the entire polyether group.

Illustrative examples of Q are given below.

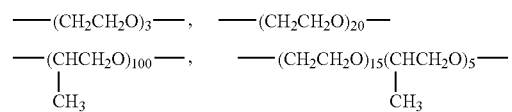

R is hydrogen or an alkyl group of 1 to 4 carbon atoms. Exemplary of the alkyl group are methyl, ethyl, n-propyl, iso-propyl, n-butyl, and iso-butyl. R is preferably hydrogen, methyl or n-butyl.

X is a divalent linking group exclusive of oxygen, for example, an alkylene or fluorinated alkylene group of 2 to 10 carbon atoms. Inter alia, ethylene and —CH$_2$CH$_2$C$_6$F$_{12}$CH$_2$CH$_2$— are preferred for ease of preparation.

Y is a divalent linking group, preferably of 2 to 10 carbon atoms. Exemplary are alkylene groups which may be separated by an ether bond (—O—) or be separated by a carbonyl group, imino group, or a combination thereof (—CONH—). Examples are illustrated below.

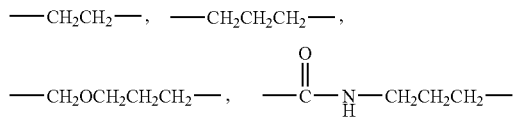

The subscript p is an integer of at least 3. It is preferred for ease of preparation that —(CH$_2$)$_p$— be an alkylene group of 3 or more carbon atoms, more preferably 3 to 6 carbon atoms, and specifically propylene. The subscript n is a positive number in the range: 0<n<3. It is possible to control characteristics of the organosilicon compound by changing the value of n.

As mentioned just above, the surface active characteristics of the fluorinated organosilicon compound having formula (1) can be controlled by changing the value of n. Since the fluorinated organosilicon compound is added to a positive photoresist composition, it should preferably have a fluorine content of 7 to 35% by weight, more preferably 9 to 30% by weight and a polyether content of 15 to 55% by weight, more preferably 30 to 45% by weight. Also, the fluorinated organosilicon compound preferably has an HLB (hydrophilic-lipophilic balance) of 4.0 to 10.0, more preferably 5.5 to 9.5.

When the fluorinated organosilicon compound is adjusted to a fluorine content and a polyether content within the above ranges and more preferably to an HLB within the above range, its surface tension reducing capability is enhanced and its balance of solvent solubility is improved, indicating that the compound is very effective as the surfactant. As a result, a photoresist composition having the compound added therein has advantages including high coating uniformity, no drying variations, and well-defined resist pattern profiles. As long as the foregoing parameters are within the ranges, the compound can exert its surface activation effect even when added in smaller amounts. Then the influence of the compound on other resist characteristics is minimized.

If the fluorine content is less than the range or if the HLB is less than the range, water repellency and oil repellency inherent to fluorine may not be fully exerted, and so the surface activation function of the compound may be reduced. If the fluorine content is more than the range or if the HLB is more than the range, solubility in solvents may be exacerbated and so the compound may fail to play the role of surfactant. If the polyether content is less than the range, solubility in solvents may be exacerbated. If the polyether content is more than the range, the fluorine content is relatively reduced, and the surface activation function of the compound may be reduced for the same reason as above.

It is noted that HLB is computed according to the equation below.

$$HLB = [\{(\text{ethylene oxide chain molecular weight})/(\text{surfactant molecular weight})\} \times 100]/5$$

The inventors has first discovered that unexpected results are obtained when a surfactant to be added to a photoresist composition has a fluorine content and a polyether content in the specific ranges and additionally a HLB in the preferred range. These restrictions are referred to nowhere in JP-A 2000-181055 which is incorporated herein by reference.

The fluorinated organosilicon compound having formula (1) can be readily prepared, for example, by subjecting an organosilicon compound having the general formula (3):

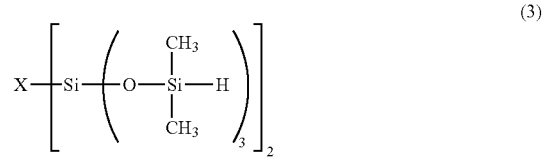

wherein X is as defined above, a fluorinated organic compound terminated with a reactive unsaturated hydrocarbon linkage, and a polyether compound having the general formula (4):

$$CH_2=CH-(CH_2)_{p-2}-O-Q-R \qquad (4)$$

wherein p, Q and R are as defined above, to hydrosilylation reaction in the presence of a platinum catalyst.

The fluorinated organic compound terminated with a reactive unsaturated hydrocarbon linkage is a compound Y'-Rd. corresponding to —Y-Rf in formula (1), wherein Y' is a group terminated with CH$_2$=CH radical which converts to Y when hydrogen is added thereto.

In the hydrosilylation reaction, the proportion of the organosilicon compound of formula (3), the fluorinated organic compound terminated with a reactive unsaturated hydrocarbon linkage, and the polyether compound of formula (4) may be adjusted as appropriate, and preferably such that the addition reaction product (or fluorinated organosilicon compound) resulting therefrom may have a fluorine content, a polyether content, and a HLB in the above-specified ranges, when the fluorinated organosilicon compound is used as a surfactant.

The platinum catalyst may be selected from platinum and platinum compounds which are commonly used in hydrosilylation reaction, and used in catalytic amounts. Hydrosilylation reaction may be effected under ordinary reaction conditions, typically at room temperature to 140° C. for 0.5 to 6 hours.

The fluorinated organosilicon compound wherein a plurality of fluorine-modified groups and hydrophilic groups are bonded to a silicon atom is effective in significantly reducing surface tension even when used in smaller amounts, as compared with ordinary fluorinated surfactants having a structure wherein a fluorine-modified group and a hydrophilic group are bonded in 1:1. It is thus useful as a fluorinated surfactant. When the fluorinated organosilicon compound is used as a fluorinated surfactant, fluorinated organosilicon compounds of formula (1) having a fluorine content and a polyether content and more preferably a HLB value all within the above-specified ranges, may be used alone or in admixture of two or more.

An appropriate amount of the fluorinated organosilicon compound is 0.001 to 2 parts by weight, more preferably 0.01 to 1 part by weight per 100 parts by weight of solids in the positive photoresist composition, excluding the organic solvent and fluorinated organosilicon compound. With too small amounts, its surface activation function may not be exerted fully. With too large amounts, resist characteristics other than coating characteristic such as shape stability and composition's shelf stability may be adversely affected.

In the practice of the invention, other hydrocarbon base surfactants, fluorochemical surfactants, silicon base surfactants, fluorine-silicon base surfactants or the like may be additionally used. Such additional surfactants which can be used include nonionic surfactants, for example, polyoxyethylene alkyl ethers such as polyoxyethylene lauryl ether, polyoxyethylene stearyl ether, and polyoxyethylene oleyl ether; polyoxyethylene alkyl phenol ethers such as polyoxyethylene octyl phenol ether and polyoxyethylene nonyl phenol ether; polyethylene glycol dialkyl esters such as polyethylene glycol dilaurate and polyethylene glycol distearate; fluorochemical surfactants, for example, Eftop EF351 and EF352 (Jemco Inc.), Megaface F-171 and F-173 (Dainippon Ink & Chemicals, Inc.), linear fluorochemical surfactants having fluoroalkyl or perfluoroalkyl groups as exemplified in JP-A 57-178242, Novec FC-4430 (Sumitomo-3M Co., Ltd.), Surflon S-381, S-383 and S-393 (Seimi Chemical Co., Ltd.); organosiloxane polymer KP341 (Shin-Etsu Chemical Co., Ltd.), and acrylic or methacrylic acid (co)polymer Polyflow Nos. 75 and 95 (Kyoeisha Chemical Co., Ltd.).

The additional surfactants may be used in amounts that do not interfere with the function of the fluorinated organosilicon compounds of formula (1). The amount of an additional surfactant differs with its identity and is preferably 0.01 to 1.0 time the amount of the fluorinated organosilicon compounds of formula (1) added.

E. Other Components

In the positive photoresist composition of the invention, a sensitizer may be formulated for enhancing the resist sensitivity. Suitable sensitizers include 2H-pyrido[3,2-b]-1,4-oxazin-3(4H)-ones, 10H-pyrido[3,2-b][1,4]-benzothiazines, urazols, hydantoins, barbituric acids, glycine anhydrides, 1-hydroxybenzotriazoles, alloxans, and maleimides. The sensitizer is typically formulated in an amount of up to 100 parts, preferably 4 to 60 parts by weight per 100 parts by weight of the 1,2-quinonediazide compound.

In the positive photoresist composition of the invention, there may be formulated colorants for rendering latent images in radiation-exposed areas visible or minimizing the influence of halation during radiation exposure, and adhesive aids for improving adhesion.

Examples of suitable colorants include oil-soluble dyes, disperse dyes or chlorine dyes such as Methyl Violet 2B (CI 42555), Malachite Green (CI 2000), Victoria Blue B (CI 44045), Neutral Red (CI 50040), Solvent Yellow 2 (CI 11020), Solvent Yellow 6 (CI 11390), Solvent Yellow 14 (CI 12055), Solvent Yellow 15 (CI 18820), Solvent Yellow 16 (CI 12700), Solvent Yellow 21 (CI 18690), Solvent Yellow D-33 (CI 47000), Solvent Yellow 56 (CI 11021), Solvent Orange 1 (CI 11920), Solvent Orange 2 (CI 12100), Solvent Orange 14 (CI 26020), Solvent Orange 40, Solvent Red 3 (CI 12010), Solvent Red 8 (CI 12715), Solvent Red 23 (CI 26100), Solvent Red 24 (CI 26105), Solvent Red 25 (CI 26110), Solvent Red 27 (CI 26125), Solvent Red (CI 45170B), Disperse Red 9 (CI 60505), Oil Scarlet 308 (CI 21260), Solvent Brown (CI 12020), Disperse Yellow 1 (CI 10345), Disperse Yellow 3 (CI 11855), Disperse Yellow 4 (CI 12770), Disperse Yellow 8 (CI 27090), Disperse Yellow 42 (CI 10338), Disperse Orange 1 (CI 11080), Disperse Orange 3 (CI 11005), Disperse Orange 5 (CI 11100), Disperse Orange 11 (CI 60700), Disperse Red 1 (CI 11110), Disperse Red 4 (CI 60755), Disperse Red 11 (CI 62015), Disperse Red 15 (CI 60710), Disperse Red 58 (CI 11135); methine dyes such as Miketone Fast Yellow 7G and Miketone Fast Orange 5R (Mitsui-Toatsu Dye Co., Ltd.), Phorone (Sandoz), Macrolex Yellow 6G (Bayer); fluorescent brighteners such as stilbene, 4,4-diaminostilbene sulfonic acid derivatives, coumarin derivatives and pyrazoline derivatives; and hydroxyazo dyes as described in JP-A 59-142538.

The colorant is typically formulated in an amount of up to 6 parts, preferably up to 4 parts by weight per 100 parts by weight of the alkali-soluble novolac resin and 1,2-quinonediazide compound combined.

Suitable adhesive aids include organosilane compounds such as 3-aminopropyltriethoxysilane, vinyltrichlorosilane, and 2-(3,4-epoxycyclohexylethyl)trimethoxysilane. The adhesive aid is typically formulated in an amount of up to 4 parts, preferably up to 2 parts by weight per 100 parts by weight of the alkali-soluble novolac resin and 1,2-quinonediazide compound combined.

Further, storage stabilizers, anti-foaming agents or the like may be incorporated in the positive photoresist composition of the invention, if necessary.

Preparation of Positive Photoresist Composition

The positive photoresist composition of the invention is prepared in solution form by dissolving the alkali-soluble resin, 1,2-quinonediazide compound, fluorinated organosilicon compound and optional additives in the solvent at a suitable concentration corresponding to the desired coating thickness, for example, a solids concentration of 5 to 50% by weight, and filtering through a filter having a pore size of about 0.2 μm, for example.

Resist Pattern Formation

In forming a resist pattern using the positive photoresist composition prepared in solution form as described above, the resist solution is applied onto a substrate, for example, a silicon wafer or glass, typically coated with a silicon oxide film, aluminum, chromium, ITO film or the like, by a suitable coating technique such as spin coating, flow casting, roll coating, or discharge nozzle coating. This is followed by selective exposure through a predetermined mask pattern. The light for exposure may be monochromatic light selected from g, h and i-line, or mixed light. After the exposure, the resist coating is developed with a developer liquid, thus forming a resist pattern. The developer used herein is preferably selected from aqueous solutions of organic alkalis such as tetramethylammonium hydroxide (TMAH) and choline and inorganic alkalis such as KOH and sodium carbonate.

EXAMPLE

Examples and Comparative Examples are given below for further illustrating the invention although they are not to be construed as limiting the invention. In Examples, all parts and percents are by weight. The weight average molecular weight (Mw) is measured by GPC.

Example 1

A positive photoresist composition was prepared by dissolving 100 parts of a cresol novolac resin with a Mw of 8,000 obtained through addition condensation of a cresol mixture of m-cresol and p-cresol in weight ratio 60/40 and formaldehyde and 27 parts of a reaction product obtained through 1:3 condensation of 2,3,4-trihydroxybenzophenone and 1,2-naphthoxydiazido-5-sulfonyl chloride in 440 parts of propylene glycol monomethyl ether acetate (PGMEA) to form a uniform solution. Then a fluorinated organosilicon compound (fluorine content 21.6%, polyether content 26.6%, HLB 5.3) having the following formula (5):

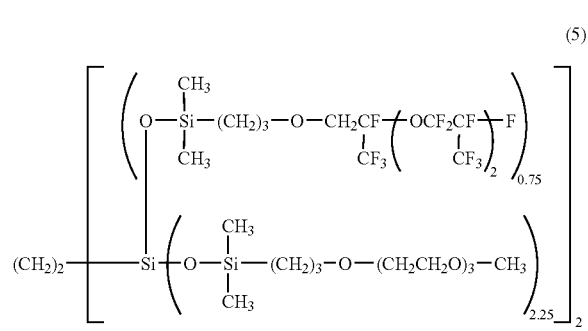

was added in an amount of 0.03 part per 100 parts of the entire solids in the solution. The solution was filtered through a membrane filter having a pore size of 0.2 μm.

Using the resist solution, the following tests were carried out for evaluating coating unevenness and the dimensional stability and profile stability of resist pattern. The results are shown in Table 1.

Coating Unevenness

Using a coater/developer CL1200 (Tokyo Electron Ltd.), the positive photoresist composition of Example 1 was built up to 100 μm on a glass substrate (1,100×1,250 mm) having a Cr film deposited thereon. This was followed by spinning and drying on a hot plate at 120° C. for 120 seconds, forming a resist coating of 1.5 μm thick. The surface of the resist coating was observed under a sodium lamp. The coating was rated good (○) when streaks indicative of coating unevenness did not occur, fair (Δ) when a few streaks were found, and poor (X) when many streaks were found.

Resist Pattern Dimensional Stability

As in the coating unevenness test, a resist coating of 1.5 μm was formed from the positive photoresist composition of Example 1. It was exposed to i-line through a reticle having a mask pattern drawn so as to reproduce a 1.0-μm line-and-space resist pattern. This was followed by development using a 2.38% TMAH solution and rinsing with deionized water. The width of 50 lines in the resist pattern thus formed were measured. A proportion of those lines off the size is expressed in percentage. A smaller percentage indicates better pattern dimensional stability.

Resist Pattern Profile Stability

As in the foregoing test, a resist coating of 1.5 μm was formed from the positive photoresist composition of Example 1 and then processed to form a 0.5-μm line-and-space resist pattern. Using a scanning electron microscope, the bottom width W1 and top width W2 of a rectangular cross section of the resist pattern as resolved when exposed at an optimum exposure dose were determined. The resist is rated as having a good pattern profile when $0.85 \leq W2/W1 \leq 1$. When the pattern bottom is footed or the pattern profile is reverse tapered, the resist is not rated as having a good pattern profile whether or not W2/W1 is within the range.

Example 2

A positive photoresist composition was prepared as in Example 1 aside from using a fluorinated organosilicon compound (fluorine content 9.1%, polyether content 41.9%, HLB 8.4) having the following formula (6) instead of the fluorinated organosilicon compound of formula (5). It was evaluated by the same tests as in Example 1. The results are shown in Table 1.

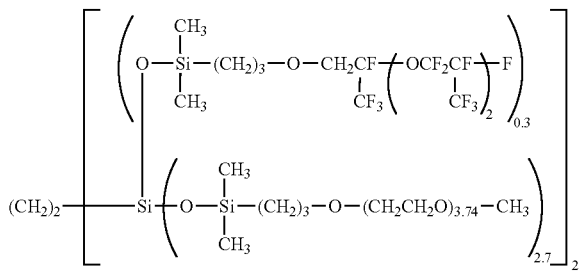

Comparative Example 1

A positive photoresist composition was prepared as in Example 1 aside from using a fluorochemical surfactant (fluorine content 31.5%, polyether content 42.9%, HLB 8.6) having the following formula (7) instead of the fluorinated organosilicon compound of formula (5). It was evaluated by the same tests as in Example 1. The results are shown in Table 1.

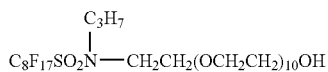

TABLE 1

| | Coating unevenness | Dimensional stability | Profile stability |
|---|---|---|---|
| Example 1 | ○ | 0 | good |
| Example 2 | ○ | 2 | good |
| Comparative Example 1 | X | 30 | poor |

Synthesis Example 1

A flask equipped with a reflux condenser and thermometer was charged with 85.7 g of a SiH-containing polysiloxane having the formula (i):

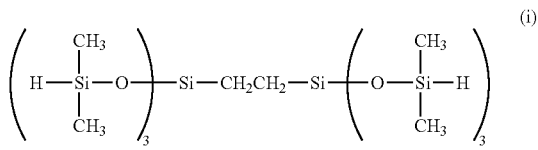

and 105.6 g of toluene and then with 0.18 g (corresponding to 0.9 mg of Pt) of a platinum/vinylsiloxane complex toluene solution. The flask was heated at 80° C., after which 125.4 g of a fluorinated organic compound having a reactive unsaturated hydrocarbon linkage represented by the formula (ii):

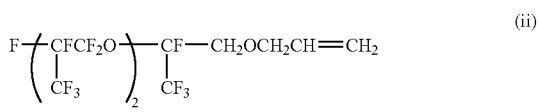

and 147.1 g of a polyether compound represented by the formula (iii):

were added dropwise to the reaction solution. After the completion of dropwise addition, the reaction solution was heated for 2 hours whereupon the absence of SiH groups was confirmed by IR spectroscopy. The solvent and low-boiling fraction were evaporated off by heating in vacuum, obtaining 320.0 g of a pale brown oily substance.

The oily substance was analyzed by ¹H-NMR and IR spectroscopy, with the results shown below.

¹H-NMR spectrum (TMS standard, ppm): 0-0.1 (36H, SiC$\underline{H}_3$), 0.1-0.2 (16H, Si—C$\underline{H}_2$—), 1.3-1.5 (12H, —C$\underline{H}_2$—), 3.1 (27H, C$\underline{H}_3$O—), 3.2-3.5 (72H, —C$\underline{H}_2$O—)

From these data, the oily substance was identified to have the structure shown below.

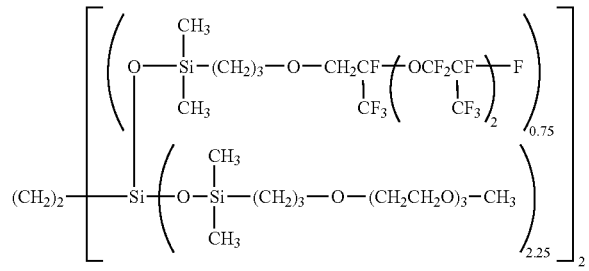

This fluorinated organic compound had a fluorine content, a polyether content, and HLB, shown below.

It is noted that HLB is computed according to the equation below.

$HLB = [\{(\text{ethylene oxide chain molecular weight})/(\text{surfactant molecular weight})\} \times 100]/5$ Japanese Patent Application No. 2005-358960 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A positive photoresist composition comprising
an alkali-soluble resin,
a 1,2-quinonediazide compound,
an organic solvent, and
a fluorinated organosilicon compound having the general formula (1):

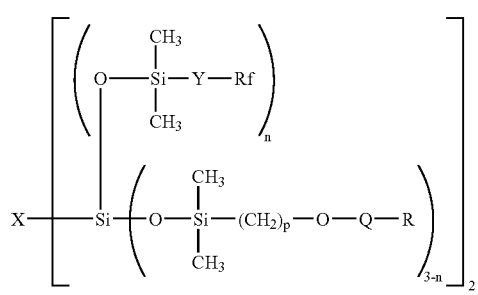

wherein Rf is a perfluoroalkyl group of 5 to 30 carbon atoms containing at least one ether bond in the molecular chain, Q is a polyether group consisting of a homopolymer chain of ethylene glycol or propylene glycol or a copolymer chain of both, R is hydrogen or an alkyl group of 1 to 4 carbon atoms, X is a divalent linking group exclusive of oxygen, Y is a divalent linking group, p is an integer of at least 3, and n is a positive number in the range: 0<n<3, the fluorinated organosilicon compound serving as a surfactant.

2. The photoresist composition of claim 1, wherein Rf in formula (1) is a group of the formula (2):

wherein s is an integer of 1 to 9.

3. The photoresist composition of claim 1, wherein the fluorinated organosilicon compound has a fluorine content of 7 to 35% by weight and a polyether content of 15 to 55% by weight.

4. The photoresist composition of claim 1, wherein Rf in formula (1) is a perfluoroalkyl group of 8 to 20 carbon atoms containing at least one ether bond in the molecular chain.

5. The photoresist composition of claim 1, wherein Rf in formula (1) is a group selected from a group of consisting of
—CF2CF2CF2OCF2CF3,
—CF2CF2CF2OCF2CF2CF2OCF3 , and

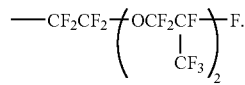

6. The photoresist composition of claim 1, wherein the fluorinated organosilicon compound having the general formula (1) includes a compound having the following formula (5) or(6):

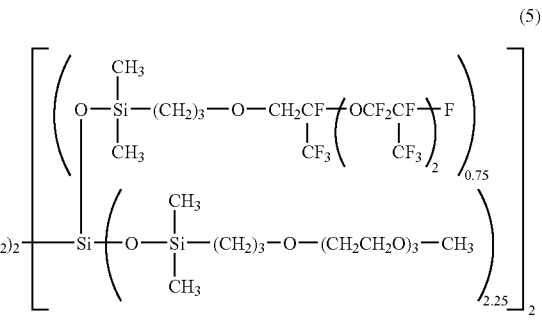

or

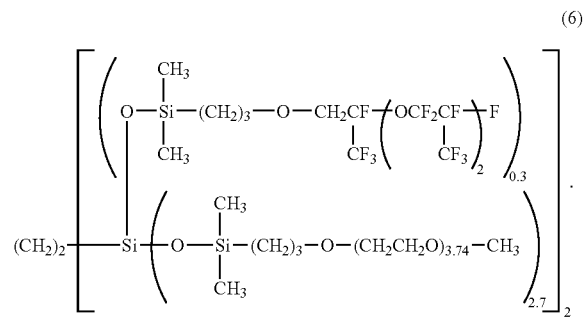

7. The photoresist composition of claim 3, wherein the fluorinated organosilicon compound having the general formula (1) has a fluorine content of 9-30% by weight and a polyether content of 15-55% by weight.

8. The photoresist composition of claim 1, wherein the fluorinated organosilicon compound having the general formula (1) is used in an amount of 0.001 to 2 parts by weight per 100 parts by weight of solids in the positive photoresist composition.

9. The photoresist composition of claim 1, wherein the 1,2-quinonediazide compound is used in an amount of 15 to 40 parts per 100 parts by weight of the alkali-soluble resin.

10. The photoresist composition of claim 1, wherein the fluorinated organosilicon compound having the general formula (1) has an HLB (hydrophilic-lipophilic balance) of 4.0 to 10.0.

* * * * *